US011569049B1

(12) United States Patent
Tubre et al.

(10) Patent No.: US 11,569,049 B1
(45) Date of Patent: Jan. 31, 2023

(54) COMBINED DUAL-CONDUCTIVE KEY SWITCH

(71) Applicants: Dongguan City Kaihua Electronics Co., Ltd, Guangdong (CN); MECHANICAL KEYBOARDS, LLC, Chandler, AZ (US)

(72) Inventors: Joel Tubre, Phoenix, AZ (US); FuXi Wu, Guangdong (CN)

(73) Assignee: Mechanical Keyboards, Chandler, AZ (US)

( * ) Notice: Subject to any disclaimer, the term of this patent is extended or adjusted under 35 U.S.C. 154(b) by 0 days.

(21) Appl. No.: 17/397,938

(22) Filed: Aug. 9, 2021

(51) Int. Cl.
*H01H 13/14* (2006.01)
*H01H 13/50* (2006.01)
*G01R 33/07* (2006.01)
*H01H 13/04* (2006.01)
*H01H 13/10* (2006.01)
*H01H 13/64* (2006.01)

(52) U.S. Cl.
CPC ............. *H01H 13/14* (2013.01); *G01R 33/07* (2013.01); *H01H 13/04* (2013.01); *H01H 13/10* (2013.01); *H01H 13/503* (2013.01); *H01H 13/64* (2013.01)

(58) Field of Classification Search
CPC ................. H01H 2221/04; H01H 5/02; H01H 2215/042; H01H 36/00; H01H 2219/004; H01H 36/0073; H01H 2003/506; H01H 36/0066; H01H 36/008; H01H 71/2409; H01H 3/125; H01H 13/705; H01H 13/14; H01H 13/04; H01H 13/10; H01H 13/70; H01H 13/704; H01H 13/7065; H01H 13/7006; H01H 13/7057; H01H 13/78; H01H 13/79; H01H 13/52; H01H 13/703; H01H 13/507; H01H 3/12; H01H 13/20
See application file for complete search history.

(56) References Cited

U.S. PATENT DOCUMENTS

2002/0061735 A1* 5/2002 Wingett ............... H01H 25/041
455/575.1

* cited by examiner

*Primary Examiner* — Ahmed M Saeed
(74) *Attorney, Agent, or Firm* — Daniel W. Roberts; Law Offices of Daniel W. Roberts, LLC

(57) ABSTRACT

A combined dual-conductive key switch including a base, a cover arranged above the base, a conductive core, a mechanical-conducting component and an inductive switch which are electrically connected to a PCB respectively; and a conduction trigger block corresponding to the mechanical-conducting component and a magnet corresponding to the inductive switch are respectively arranged on the conductive core; and the conduction trigger block triggers a conduction stroke of conducting the mechanical-conducting component, which is different from a conduction stroke of conducting the inductive switch triggered by the magnet. The combined dual-conductive key switch is provided for achieving dual-conductive functions of pressing once and performing two actions for a product.

6 Claims, 6 Drawing Sheets

COMBINED DUAL-CONDUCTIVE KEY SWITCH

TECHNICAL FIELD

The utility model relates to a key switch, in particular to a combined dual-conductive key switch.

BACKGROUND ART

At present, when a key switch on the market is pressed once, the key switch is only conducted once, that is, the key switch only has a single conduction, function. Along with the wide application of the key switch, people not only have continuously improved requirement for the performance of the key switch, but also have higher and higher function requirement for the key switch.

For example, it is required that when the key switch is pressed once, it can be conducted twice. When it is applied to games, the key switch with the function of being pressed once and conductive twice has higher speed and provides better user experience for players compared with the traditional key switch.

However, the key switches with the function of being pressed once and conductive twice have not been available on the market today.

SUMMARY OF THE UTILITY MODEL

For the defects above, the purpose of the utility model is to provide a combined dual-conductive key switch for achieving dual-conductive functions of pressing once and performing two actions for a product, which gives more functions to the key switch and provides better user experience.

The technical solution adopted by the utility model for achieving the above purpose is as follows.

A combined dual-conductive key switch comprises a base, a cover arranged above the base and a conductive core, wherein it further comprises a mechanical-conducting component and an inductive switch which are electrically connected to a PCB respectively; and a conduction trigger block corresponding to the mechanical-conducting component and a magnet corresponding to the inductive switch are respectively arranged on the conductive core; and the conduction trigger block triggers a conduction stroke of conducting the mechanical-conducting component, which is different from a conduction stroke of conducting the inductive switch triggered by the magnet.

As a further improvement of the utility model, the height of the outer edge of the conduction trigger block close to the mechanical-conducting component is not equal to the height of the magnet from the highest point of the induction distance between the magnet and the inductive switch.

As a further improvement of the utility model, the height of the outer edge of the conduction trigger block close to the mechanical-conducting component is less than the height of the magnet from the highest point of the induction distance between the magnet and the inductive switch.

As a further improvement of the utility model, the height of the outer edge of the conduction trigger block close to the mechanical-conducting component is greater than the height of the magnet from the highest point of the induction distance between the magnet and the inductive switch.

As a further improvement of the utility model, an inclined surface is formed on the top of a side edge of the conduction trigger block.

As a further improvement of the utility model, the mechanical-conducting component comprises a stationary plate and a movable plate, a stationary contact is provided on the stationary plate, a movable contact corresponding to the stationary contact is provided on the movable plate, and at least one contact protrusion corresponding to the conduction trigger block is formed on the movable plate.

As a further improvement of the utility model, the inductive switch is one of a magnetic inductor and a Hall element.

As a further improvement of the utility model, a protruded mounting portion into which the magnet is inserted is protruded outward from a side edge of the conductive core.

As a further improvement of the utility model, an abdicating opening for the protruded mounting portion to move up and down is formed on the base, and the inductive switch is provided on an outer side edge of the abdicating opening.

The utility model has the following beneficial effects. In a single key switch, the mechanical-conducting component, and the inductive switch are additionally arranged. When the conduction stroke of conducting the mechanical-conducting component triggered by the conduction trigger block is set to be different from the conduction stroke of conducting the inductive switch triggered by the magnet, two groups of conduction components are triggered to conduct in sequence by pressing the conductive core downwards, thereby achieving dual-conductive functions of pressing once and performing two actions for a product, which gives more functions to the key switch and provides better user experience.

The above mentioned is an overview of the technical scheme of the utility model. The following is a further explanation of the utility model in combination with the attached drawings and specific implementations.

DETAILED DESCRIPTION

Figure 1:
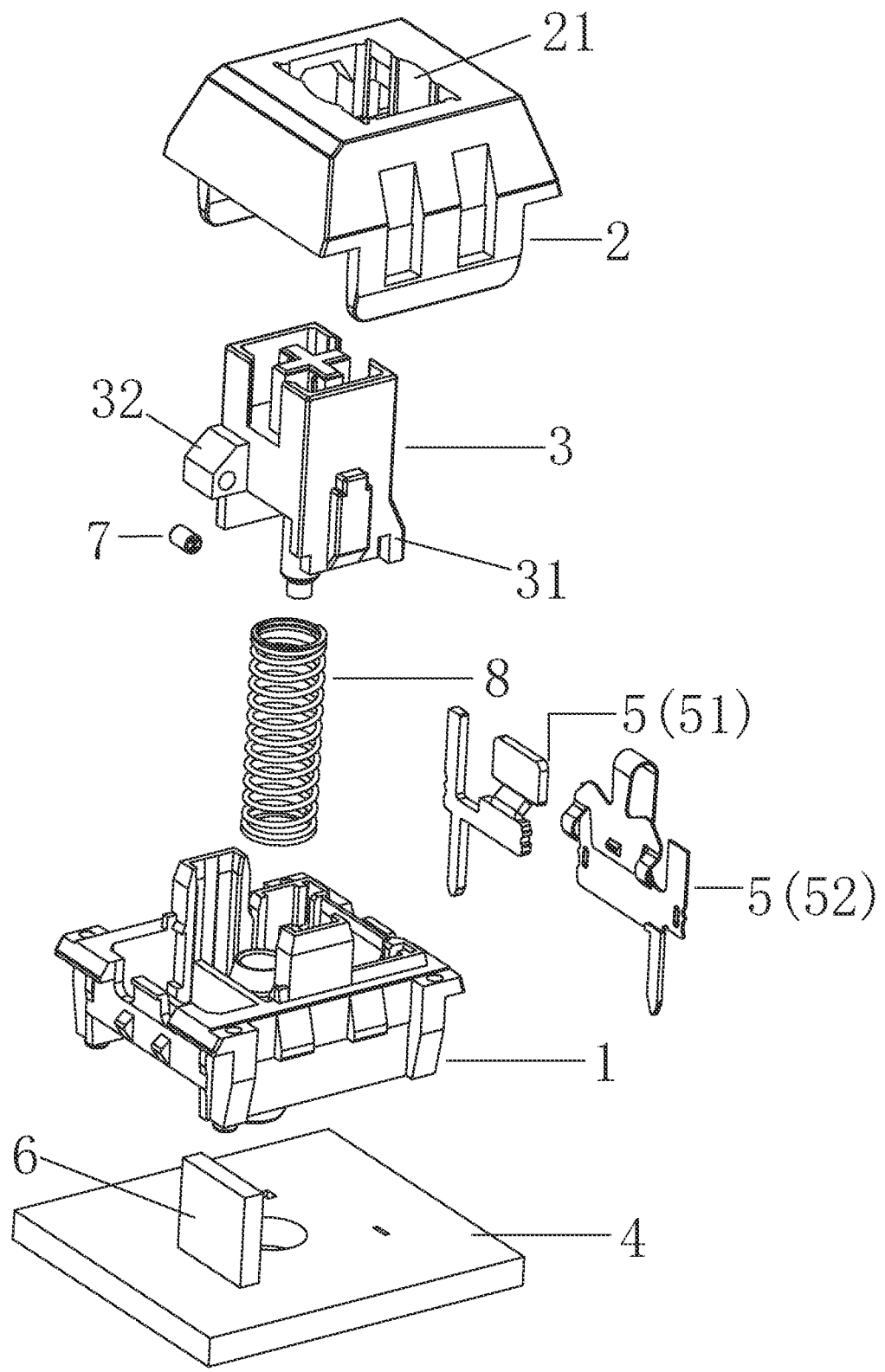
FIG. 1 is an exploded view of the utility model.
Figure 2:
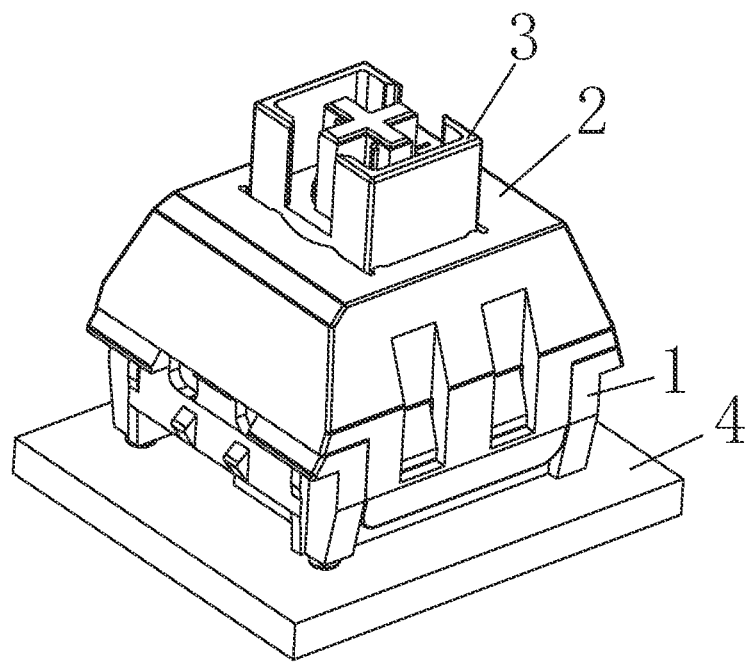
FIG. 2 is a schematic view of the external structure of the utility model.

In order to further explain the technical means and effects of the present utility model for achieving the intended purpose, the following detailed description of the embodiments of the present utility model will be made with reference to the accompanying drawings and preferred embodiments.

Referring to FIGS. 1 to 4, the embodiment provides a combined dual-conductive key switch comprising a base 1, a cover 2 arranged above the base 1, and a conductive core 3, wherein an opening 21 for allowing an upper part of the conductive core 3 to pass through is formed in the cover 2 so as to press the conductive core 3 downwards to trigger the conduction of the key switch. The combined dual-conductive key switch of the embodiment further comprises a mechanical-conducting component 5 and an inductive switch 6 which are electrically connected to a PCB 4 respectively; a conduction trigger block 31 corresponding to the mechanical-conducting component 5 and a magnet 7 corresponding to the inductive switch 6 are respectively arranged on the conductive core 3; and the conduction trigger block 31 triggers the conduction stroke of conducting the mechanical-conducting component 5, which is different from a conduction stroke of conducting the inductive switch 6 triggered by the magnet 7. When the conductive core 3 is pressed to move downwards, the conduction trigger block 31 and the magnet 7 move downwards along therewith. Due to the fact that the conduction stroke of the conduction trigger block 31 triggers the conduction stroke of conducting the mechanical-conducting component 5, which is different from the conduction stroke of conducting the inductive switch 6 triggered by the magnet 7, the conduction trigger block 31 and the magnet 7 can trigger the conduction of the corresponding conduction component sequentially, achieving the purpose of conducting in sequence.

Specifically, as shown in FIGS. 1, 4 to 9 and 11, the mechanical-conducting component 5 comprises a stationary plate 51 and a movable plate 52, a stationary contact 511 is provided on the stationary plate 51, a movable contact 521 corresponding to the stationary contact 511 is provided on the movable plate 52, and at least one contact protrusion 522 corresponding to the conduction trigger block 31 is formed on the movable plate 52. Meanwhile, an inclined surface 311 is formed on the top of a side edge of the conduction trigger block 31. When the conductive core 3 is not pressed and is in a natural state, the contact protrusion 522 of the movable plate 52 is pushed outwards by the conduction trigger block 31, so that the movable plate 52 is elastically deformed, the movable contact 521 on the movable plate 52 is separated from the stationary contact 511 on the stationary plate 51, and the mechanical-conducting component 5 is in an off state; when the conductive core 3 is pressed and moves downwards, the conduction trigger block 31 moves downwards therewith; when the conductive core 3 moves downwards for a certain stroke, the conduction trigger block 31 is separated from the contact protrusion 522 on the movable plate 52 and contacts an inclined surface 311, the outward force applied to the movable plate 52 is reduced, the movable plate 52 is elastically reset, and the movable contact 521 on the movable plate 52 is in contact with the stationary contact 511 on the stationary plate 51. Then, the mechanical-conducting component 5 is in a conductive state.

Specifically, the inductive switch 6 in the embodiment is one of a magnetic inductor and a Hall element. When the inductive switch 6 is a magnetic inductor, the magnet 7 and the inductive switch 6 are combined to form a magnetic inductive switch. When the inductive switch 6 is a Hall element, the magnet 7 and the inductive switch 6 are combined to form a Hall inductive switch.

Specifically, the working principle of the magnetic inductive switch is as follows.

In a natural state, when the distance between the magnet 7 on the conductive core 3 and the magnetic inductor on the PCB 4 is far enough, that is, the distance between the magnet 7 and the magnetic inductor is greater than the induction distance between the both, the magnetic inductor on the PCB 4 cannot induct the magnetism of the magnet 7 on the conductive core 3, and the circuit is disconnected, that is, the magnetic inductive switch is in an off state.

When the conductive core 3 is pressed downwards, the conductive core 3 drives the magnet 7 to act downwards. When the conductive core 3 is pressed downwards to a certain stroke, and the distance between the magnet 7 and the magnetic inductor reaches the induction distance between the both, the magnetic inductor inducts the magnetism, and the circuit is conducted, that is, the magnetic inductive switch is in an on state.

When the pressing of the conductive core 3 is released, the conductive core 3 moves upwards and resets under the elastic restoring force of the spring 8 to drive the magnet 7 to move upwards. When the distance between the magnet 7 and the magnetic inductor is greater than the induction distance between the both, the magnetic inductor cannot induct the magnetism of the magnet 7, the circuit is disconnected, and the magnetic inductive switch returns to the off state.

Specifically, the working principle of the Hall inductive switch is as follows.

In a natural state, when the distance between the magnet 7 on the conductive core 3 and the Hall element on the PCB 4 is far enough, that is, the distance between the magnet 7 and the Hall element is greater than the induction distance between the magnet 7 and the Hall element, and the Hall element cannot induct the magnetism of the magnet 7 on the conductive core 3, that is, no signal is generated by the Hall element; and the circuit is disconnected, that is, the Hall inductive switch is in an off state.

When the conductive core 3 is pressed downwards, the conductive core 3 drives the magnet 7 to move downwards. When the conductive core 3 is pressed downwards to a certain stroke, and the distance between the magnet 7 and the Hall element reaches the induction distance between the both, the Hall element inducts the magnetism, that is, the Hall element generates a signal (for example, a signal of changing a resistance value, a signal of changing the voltage value and the like). Along with the increase of the magnetic force, the signal value is also increased along therewith, and linearly increased, and the electrical property is output, the circuit is conducted, namely the Hall inductive switch is in an on state.

When the pressing of the conductive core 3 is released, the conductive core 3 moves upwards and resets under the action of the elastic restoring force of the spring 8 to drive the magnet 7 to move upwards. When the distance between the magnet 7 and the Hall element is greater than the induction distance between the both, the Hall element cannot conduct the magnetism of the magnet 7, that is, no signal is generated by the Hall element, the circuit is disconnected, and the Hall inductive switch returns to the off state.

Figure 3:
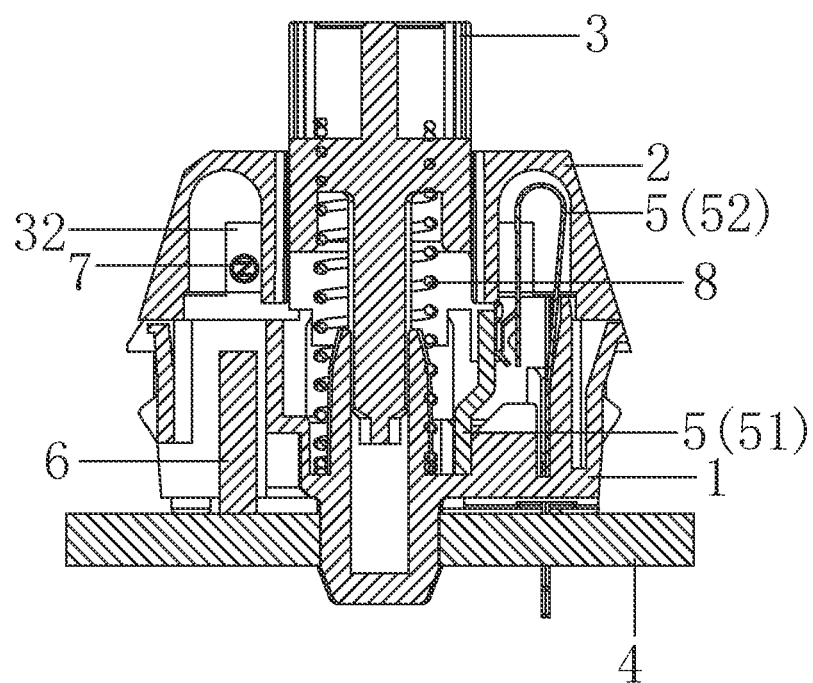
FIG. 3 is a sectional view of the utility model.
Figure 4:
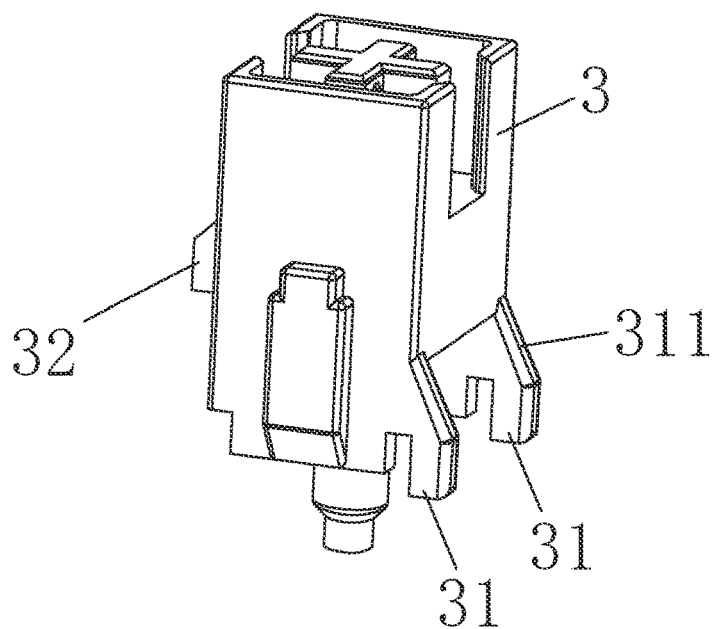
FIG. 4 is a schematic view of the structure of a conductive core in the utility model.
Figure 10:
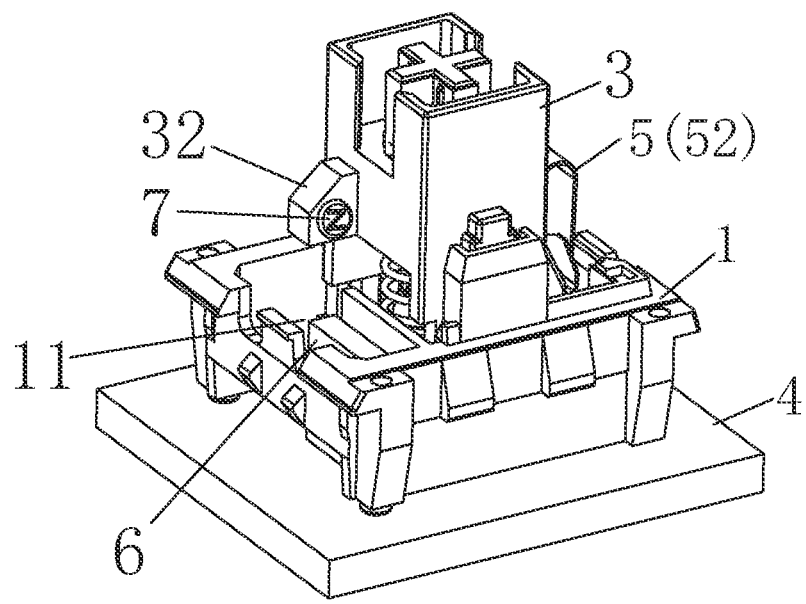
FIG. 10 is a schematic view of a part of the structure of the utility model.
Figure 11:
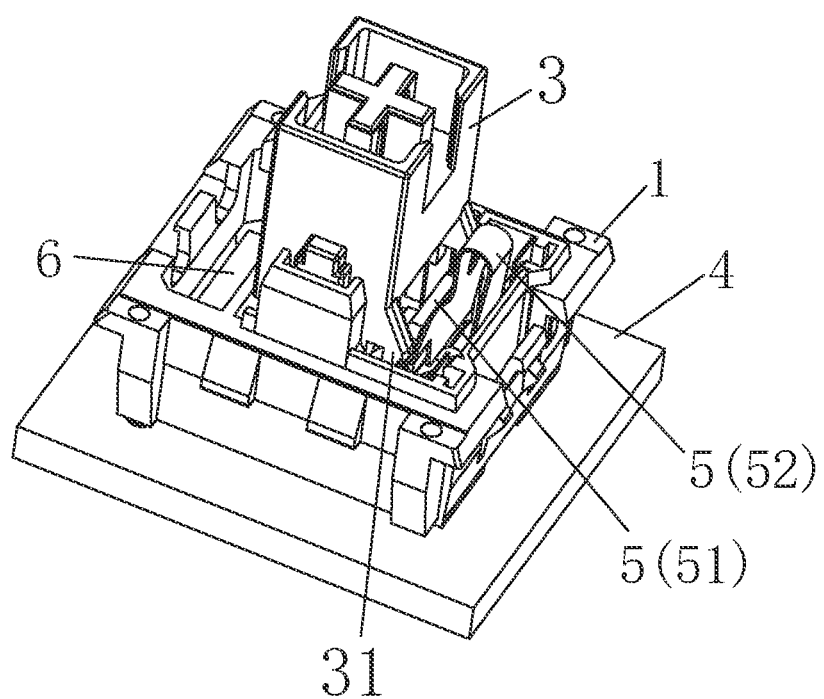
FIG. 11 is a schematic view of another part of the structure of the utility model.

In the present embodiment, as shown in FIGS. 1 and 3, for the mounting of the magnet 7, a protruded mounting portion 32 into which the magnet is inserted is protruded outward from a side edge of the conductive core 3. When the protruded mounting portion 32 moves up and down along with the conductive core 3 as a whole, the magnet 7 moves up and down along with the protruded mounting portion 32 synchronously to achieve the purpose of triggering the conduction of the inductive switch 6. Meanwhile, as shown in FIG. 10, an abdicating opening 11 for the protruded mounting portion 32 to move up and down is formed on the base 1, and the inductive switch 6 is provided on an outer side edge of the abdicating opening 11.

Figure 5:
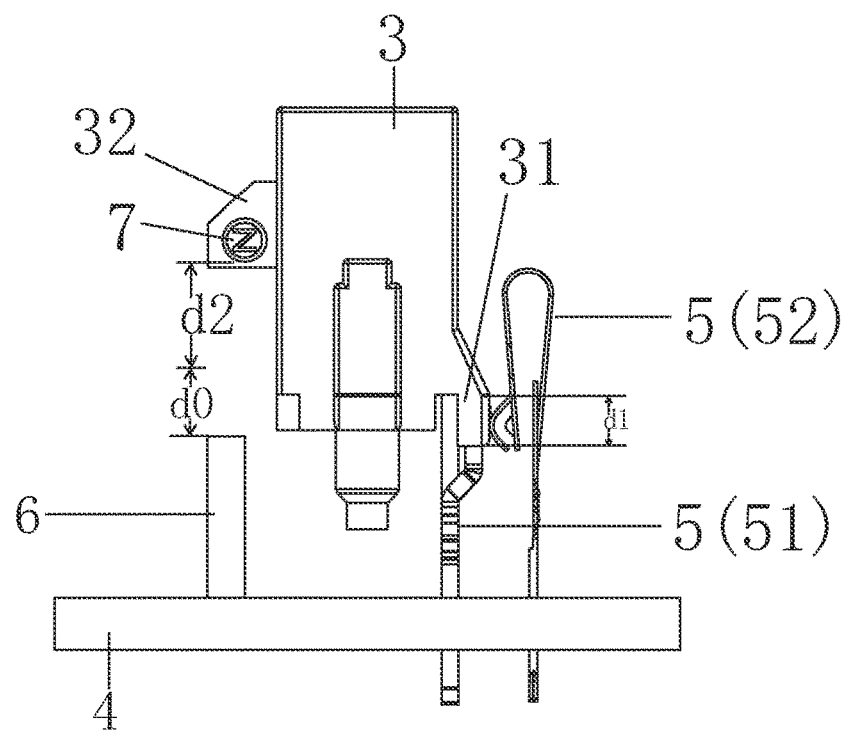
FIG. 5 is a structural diagram showing that a height d1 of the outer edge of a conduction trigger block close to a mechanical-conducting component is less than a height d2 of a magnet from a highest point of an induction distance d0 between the magnet and the inductive switch in the utility model.

According to the structural characteristics of the mechanical-conducting component 5 and the inductive switch 6, the conduction strokes of the mechanical-conducting component 5 and the inductive switch 6 can be set as follows. As shown in FIG. 5, the height d1 of the outer edge of the conduction, trigger block 31 close to the mechanical-conducting component 5 is not equal to the height d2 of the magnet 7 from the highest point of the induction distance d0 between the magnet 7 and the inductive switch 6, thereby realizing different conduction strokes. In the specific structural design, the method can be realized in the following two ways.

Figure 6:
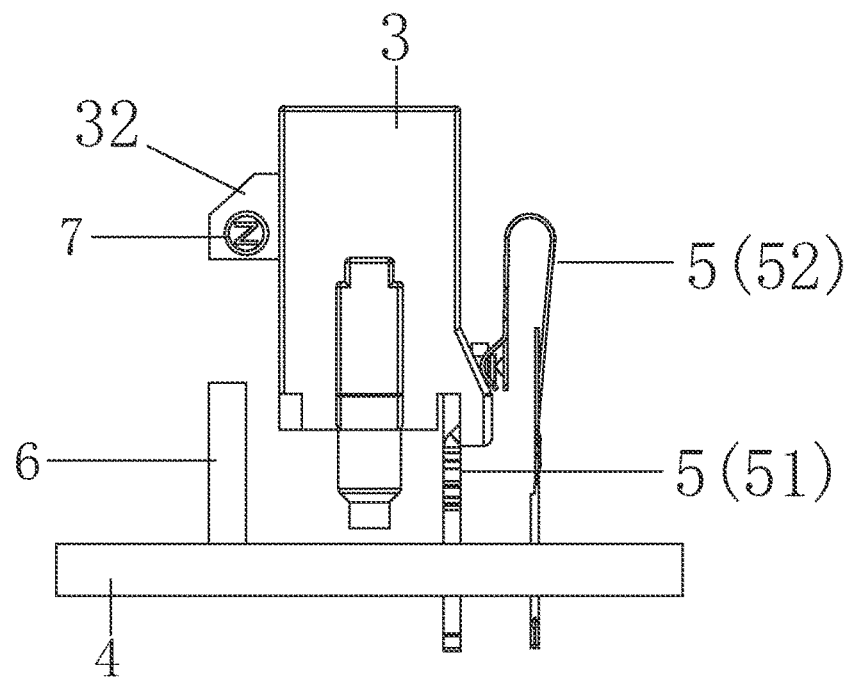
FIG. 6 is a schematic view showing the structure in which the mechanical-conducting component is conducted earlier when the height d1 of the outer edge of the conduction trigger block close to the mechanical-conducting component is less than the height d2 of the magnet from the highest point of the induction distance d0 between the magnet and the inductive switch in the utility model.

(1) The height d1 of the outer edge of the conduction trigger block 31 close to the mechanical-conducting component 5 is less than the height d2 of the magnet 7 from the highest point of the induction distance d0 between the magnet 7 and the inductive switch 6, as shown in FIG. 5. When the conductive core 3 is pressed to move downwards, the conduction trigger block 31 and the magnet 7 move downwards synchronously. Since the height d1 of the outer edge of the conduction trigger block 31 close to the mechanical-conducting component 5 is less than the height d2 of the magnet 7 from the highest point of the induction distance d0 between the magnet 7 and the inductive switch 6, the movable plate 52 of the mechanical-conducting component 5 is elastically reset when the stroke of the conductive core 3 moving downwards exceeds the height d1; and the movable contact 521 on the movable plate 52 is in contact with the stationary contact 511 on the stationary plate 51, and the mechanical-conducting component 5 is then conducted earlier, as shown in FIG. 6. The conductive core 3 continues to move downwards until the distance between the magnet 7 and the inductive switch 6 reaches the induction distance d0 between the magnet 7 and the inductive switch 6, the inductive switch 6 inducts the magnetism, the circuit is conducted, and then the inductive switch 6 is conducted later. Therefore, the mechanical-conducting component 5 is conducted earlier as compared to the inductive switch 6, thereby achieving the purpose of conducting in sequence.

When the pressing of the conductive core 3 is released and the conductive core 3 moves upwards and resets, the conduction trigger block 31 and the magnet 7 move upwards synchronously, and the distance between the magnet 7 and the inductive switch 6 is greater than the induction distance d0 between the both, the inductive switch 6 cannot induct the magnetism of the magnet 7, and the inductive switch 6 is disconnected earlier. When the conductive core 3 continues to move upwards, and the conduction trigger block 31 pushes the movable plate 52 outwards, the mechanical-conducting component 5 is disconnected later, i.e. the inductive switch 6 is disconnected before the mechanical-conducting component 5.

Figure 7:
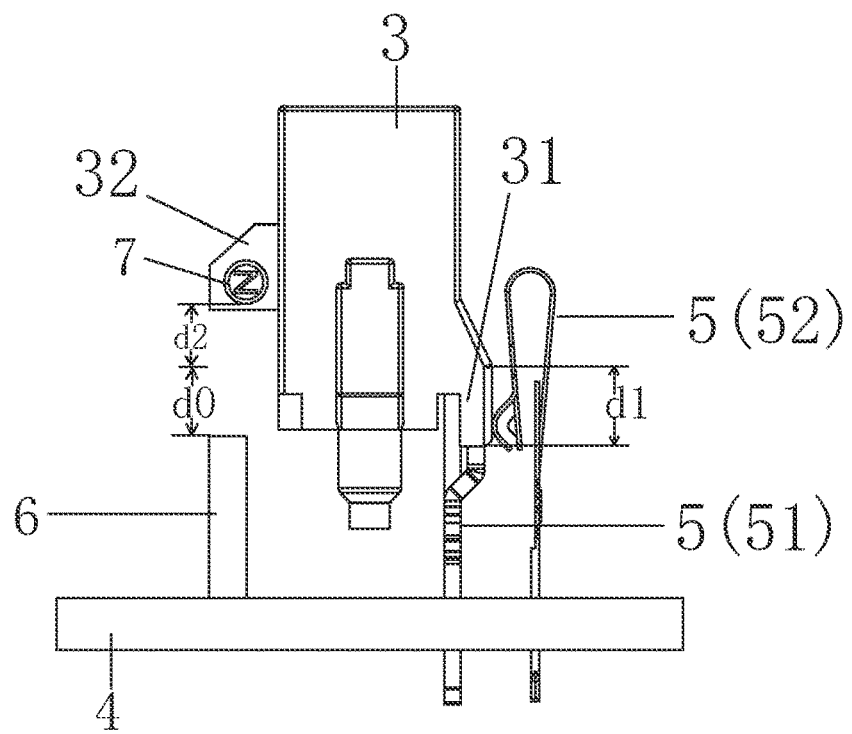
FIG. 7 is a structural view showing a structure in which the height d1 of the outer edge of the conduction trigger block close to the mechanical-conducting component is greater than the height d2 of the magnet from the highest point of the induction distance d0 between the magnet and the inductive switch in the utility model.
Figure 8:
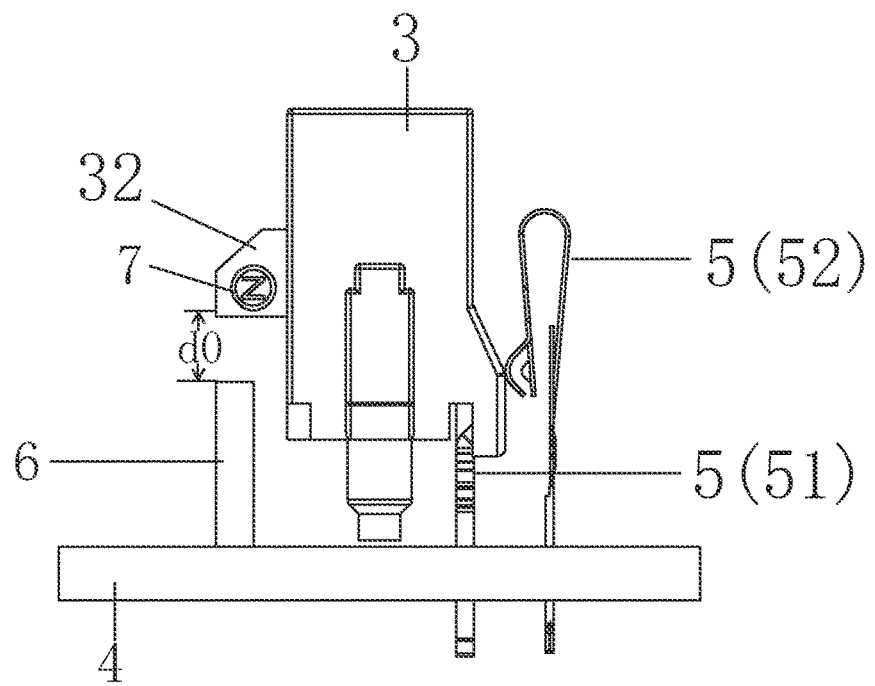
FIG. 8 is a schematic view showing the structure in which the inductive switch is conducted earlier when the height d1 of the outer edge of the conduction trigger block close to the mechanical conduction assembly is greater than the height d2 of the magnet from the highest point of the induction distance d0 between the magnet and the inductive switch in the utility model.
Figure 9:
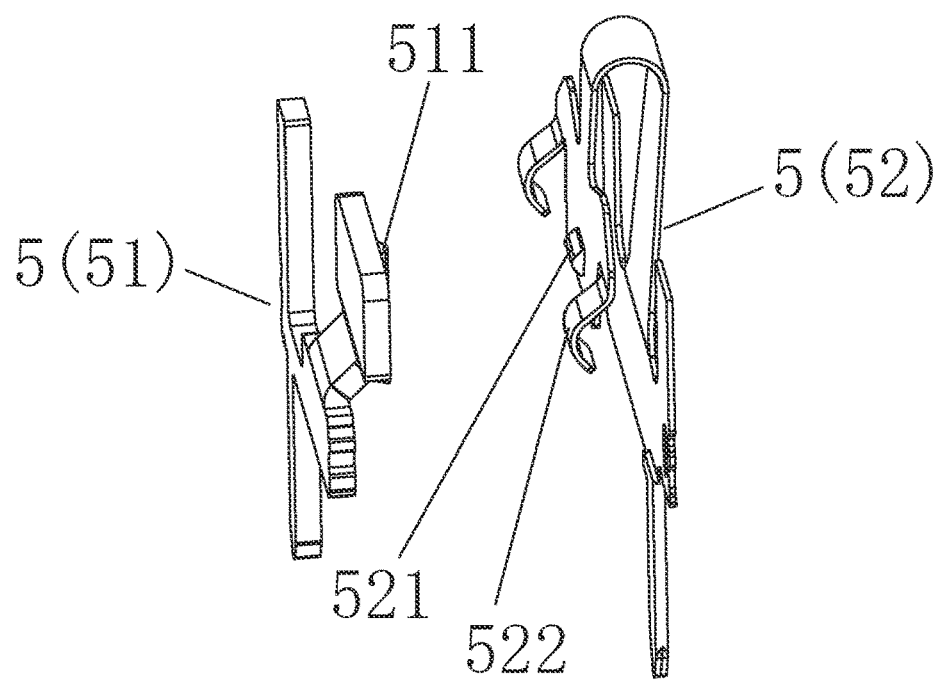
FIG. 9 is a schematic structural view of a mechanical-conducting component in the utility model.

(2) The height d1 of the outer edge of the conduction trigger block 31 close to the mechanical-conducting component 5 is greater than the height d2 of the magnet 7 from the highest point of the induction distance d0 between the magnet 7 and the inductive switch 6, as shown in. FIG. 7. When the conductive core 3 is pressed to move downwards, the conduction trigger block 31 and the magnet 7 move downwards synchronously. Since the height d1 of the outer edge of the conduction trigger block 31 close to the mechanical-conducting component 5 is greater than the height d2 of the magnet 7 from the highest point of the induction distance d0 between the magnet 7 and the inductive switch 6, and when the distance between the magnet 7 and the inductive switch 6 reaches the induction distance d0 between the magnet 7 and the inductive switch 6 along with the downward movement of the conductive core 3, as shown in FIG. 8, the inductive switch 6 inducts the magnetism, the circuit is conducted, and then the inductive switch 6 is conducted earlier. The conductive core 3 continues to move downwards until the stroke moving downwards exceeds the height d1, the movable plate 52 of the mechanical-conducting component 5 is elastically reset, the movable contact 521 on the movable plate 52 is in contact with the stationary contact 511 on the stationary plate 51, and the mechanical-conducting component 5 is conducted later, thereby achieving the purpose of conducting in sequence.

When the pressing of the conductive core 3 is released and the conductive core 3 moves upwards and resets, the conduction trigger block 31 and the magnet 7 move upwards synchronously, and the conduction trigger block 31 pushes the movable plate 52 outwards firstly, so that the mechanical-conducting component 5 is disconnected firstly; when the conductive core 3 continues to move upwards, and the distance between the magnet 7 and the inductive switch 6 is greater than the induction distance d0 between the both, the inductive switch 6 cannot induct the magnetism of the magnet 7, and the inductive switch 6 is off later.

In the description above, only the preferred embodiments of the utility model has been described, and the technical scope of the utility model is not limited in any way. Therefore, other structures obtained by adopting the same or similar technical features as those of the above embodiments of the utility model are within the scope of the utility model.

The invention claimed is:
1. A combined dual-conductive key switch comprising
  a base,
  a cover arranged above the base, and
  a conductive core, wherein
  the combined dual-conductive key switch further comprises a mechanical-conducting component and an inductive switch which are electrically connected to a PCB respectively; and
  a conduction trigger block corresponding to the mechanical-conducting component and a magnet corresponding to the inductive switch are respectively arranged on the conductive core;
  and the conduction trigger block triggers a conduction stroke of conducting the mechanical-conducting component, which is different from a conduction stroke of conducting the inductive switch triggered by the magnet;
  a height of an outer edge of the conduction trigger block close to the mechanical-conducting component is greater than a height of the magnet from a highest point of an induction distance between the magnet and the inductive switch.

2. The combined dual-conductive key switch according to claim 1, wherein an inclined surface is formed on a top of a side edge of the conduction trigger block.

3. The combined dual-conductive key switch according to claim 1, wherein the mechanical-conducting component comprises a stationary plate and a movable plate, a stationary contact is provided on the stationary plate, a movable contact corresponding to the stationary contact is provided on the movable plate, and at least one contact protrusion corresponding to the conduction trigger block is formed on the movable plate.

4. The combined dual-conductive key switch according to claim 1, wherein the inductive switch is one of a magnetic inductor and a Hall element.

5. The combined dual-conductive key switch according to claim 1, wherein a protruded mounting portion into which the magnet is inserted is protruded outward from a side edge of the conductive core.

6. The combined dual-conductive key switch according to claim 5, wherein an abdicating opening for the protruded mounting portion to move up and down is formed on the base, and the inductive switch is provided on an outer side edge of the abdicating opening.

\* \* \* \* \*